United States Patent
Momose et al.

(10) Patent No.: US 10,208,992 B2
(45) Date of Patent: Feb. 19, 2019

(54) COOLING-ABNORMALITY DETECTING SYSTEM

(71) Applicant: Mitsubishi Electric Corporation, Tokyo (JP)

(72) Inventors: Ryuji Momose, Tokyo (JP); Katsuhiko Saito, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 585 days.

(21) Appl. No.: 14/848,611

(22) Filed: Sep. 9, 2015

(65) Prior Publication Data

US 2016/0091234 A1 Mar. 31, 2016

(30) Foreign Application Priority Data

Sep. 30, 2014 (JP) ................................. 2014-201464

(51) Int. Cl.
*F25B 49/00* (2006.01)
*G06F 1/20* (2006.01)
(Continued)

(52) U.S. Cl.
CPC ............. *F25B 49/005* (2013.01); *G06F 1/20* (2013.01); *G06F 1/206* (2013.01);
(Continued)

(58) Field of Classification Search
CPC ........ F25B 49/005; F25B 49/00; G05D 23/00
See application file for complete search history.

(56) References Cited

U.S. PATENT DOCUMENTS

2002/0196835 A1* 12/2002 Schonath ............... G01N 25/18
374/45
2006/0171662 A1* 8/2006 Nagata ..................... G06F 1/206
386/241
(Continued)

FOREIGN PATENT DOCUMENTS

CN 102298102 A 12/2011
CN 102724846 A 10/2012
(Continued)

OTHER PUBLICATIONS

M. Thirumaleshwar, Fundamentals of Heat and Mass Transfer, Mar. 2006, Pearson India, section 2.4 retrieved from the internet Jul. 25, 2018 http://techbus.safaribooksonline.com/book/chemical-engineering/9789332503397/chapter-2dot-fourier-law-and-its-consequences/ch2_sub2_4_xhtml?uicode=usptogov.*
(Continued)

*Primary Examiner* — Ljiljana Ciric
*Assistant Examiner* — Alexis Cox
(74) *Attorney, Agent, or Firm* — Posz Law Group, PLC

(57) ABSTRACT

A cooling-abnormality detecting system in which a heat generating component and a cooling component contact each other via a contact section, and the cooling component cools the heat generating component. The cooling-abnormality detecting system includes: a heat-generating-component-temperature detecting sensor, a heat-generating-component-power-consumption detecting sensor, a cooling-component-temperature detecting sensor, and a processor that calculates a heat resistance value of the contact section between the heat generating component and the cooling component and determines the presence or absence of an abnormality in the contact section.

13 Claims, 4 Drawing Sheets

(51) Int. Cl.
  *H05K 7/20* (2006.01)
  *H01L 23/34* (2006.01)
  *H01L 23/467* (2006.01)
  *H01L 23/473* (2006.01)

(52) U.S. Cl.
  CPC ......... *H05K 7/20209* (2013.01); *H01L 23/34* (2013.01); *H01L 23/467* (2013.01); *H01L 23/473* (2013.01); *Y02D 10/16* (2018.01)

(56) References Cited

U.S. PATENT DOCUMENTS

| | | | | |
|---|---|---|---|---|
| 2007/0168151 | A1* | 7/2007 | Kernahan | G01K 7/425 702/132 |
| 2013/0228773 | A1* | 9/2013 | Kurokawa | H01L 29/26 257/43 |
| 2013/0257517 | A1 | 10/2013 | Kawashima | |
| 2013/0262828 | A1* | 10/2013 | Yoneda | G06F 9/30145 712/208 |
| 2013/0321041 | A1 | 12/2013 | Kim et al. | |
| 2013/0326244 | A1* | 12/2013 | Koyama | G06F 1/26 713/300 |
| 2014/0060773 | A1 | 3/2014 | Wajima | |

FOREIGN PATENT DOCUMENTS

| | | |
|---|---|---|
| CN | 103155386 A | 6/2013 |
| JP | 2002-195967 A | 7/2002 |
| JP | 3818082 B2 | 9/2006 |
| JP | 2009-225541 A | 10/2009 |
| JP | 2012-038769 A | 2/2012 |
| JP | 4891423 B2 | 3/2012 |
| JP | 5289546 B2 | 9/2013 |
| WO | 2013/005520 A1 | 1/2013 |

OTHER PUBLICATIONS

Office Action dated Mar. 14, 2017 issued in the corresponding JP application No. 2014-201464 (and partial English translation).

Office Action dated Sep. 15, 2017 corresponding to CN patent application No. 201510615799.X (and English machine translation attached).

Official Communication dated Dec. 15, 2017 issued in corresponding EP patent application No. 15184467.7.

Extended European Search Report dated Feb. 4, 2016 in the corresponding EP application No. 15184467.7.

* cited by examiner

COOLING-ABNORMALITY DETECTING SYSTEM

BACKGROUND OF THE INVENTION

1. Field of the Invention

The present invention relates to a cooling-abnormality detecting system that detects abnormality in a contact section between a heat generating component and a cooling component that is in contact with the heat generating component and radiates heat.

2. Description of the Related Art

There has been generally used an air cooling system or a water cooling system in which a cooling unit is provided in contact with a heat generating unit, which has a large heat value, to radiate heat of the heat generating unit and the heat generating unit is cooled by the air or water. In some air conditioners, a cooling system using a coolant other than the air and the water has been put into practical use. In these cooling systems, it is important to make the heat generating unit and the cooling unit in contact with each other so as to reduce a heat resistance value between the heat generating unit and the cooling unit. Therefore, a heat conductive material is disposed between the heat generating unit and the cooling unit to secure adhesion of the heat generating unit and the cooling unit. Examples of the heat conductive material include silicon grease. Abnormality detection in the cooling systems is performed on the basis of the temperature of the heat generating component, the power consumption of the heat generating component, and ambient temperature.

Illustrated Japanese Patent Application Laid-Open No. 2011-253887 discloses that it is an object thereof to "provide an abnormality-inspecting system capable of inspecting abnormality such as a mounting failure and a failure of a cooling unit of an electronic circuit with a reliable and simple method". Japanese Patent Application Laid-Open No. 2011-253887 also discloses "an abnormality inspecting system of a cooling unit in an electric circuit 1 including a heat generating component 2 and a cooling unit 3 that cools the heat generating component includes: a component-temperature detecting unit 4 that detects the temperature of the heat generating component 2; a consumed-current detecting unit 5 that detects a consumed electric current in the heat generating component 2; and an abnormality determining unit 7 that determines abnormality of the cooling unit 3 on the basis of the component temperature detected by the component-temperature detecting unit 4 and the consumed electric current detected by the consumed-current detecting unit 5".

However, according to the conventional technology, it is only detected that abnormality has occurred in a cooling system when the component temperature is high regardless the consumed electric current is small. Abnormality to be detected is abnormality of the entire cooling system. Therefore, detection of presence or absence of abnormality in the entire cooling system is possible. However, there is a problem in that a specific abnormal part cannot be specified.

SUMMARY OF THE INVENTION

It is an object of the present invention to at least partially solve the problems in the conventional technology.

A cooling-abnormality detecting system of the present invention performs abnormality detection for a cooling system in which a heat generating component and a cooling component come into contact with each other via a contact section and the cooling component performs heat radiation from the heat generating component. The cooling-abnormality detecting system includes: a heat-generating-component-temperature detecting unit that detects temperature of the heat generating component; a heat-generating-component-power-consumption detecting unit that detects a power consumption value in the heat generating component; a cooling-component-temperature detecting unit that detects temperature of the cooling component; and a heat-resistance calculating unit that calculates a heat resistance value of the contact section between the heat generating component and the cooling component using the temperature of the heat generating component, the temperature of the cooling component, and the power consumption value and outputs the heat resistance value. The cooling-abnormality detecting system performs abnormality detection for the contact section between the heat generating component and the cooling component according to the heat resistance value.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of the present invention are explained in detail below with reference to the drawings. Note that the present invention is not limited by the embodiments.

First Embodiment

Figure 1:
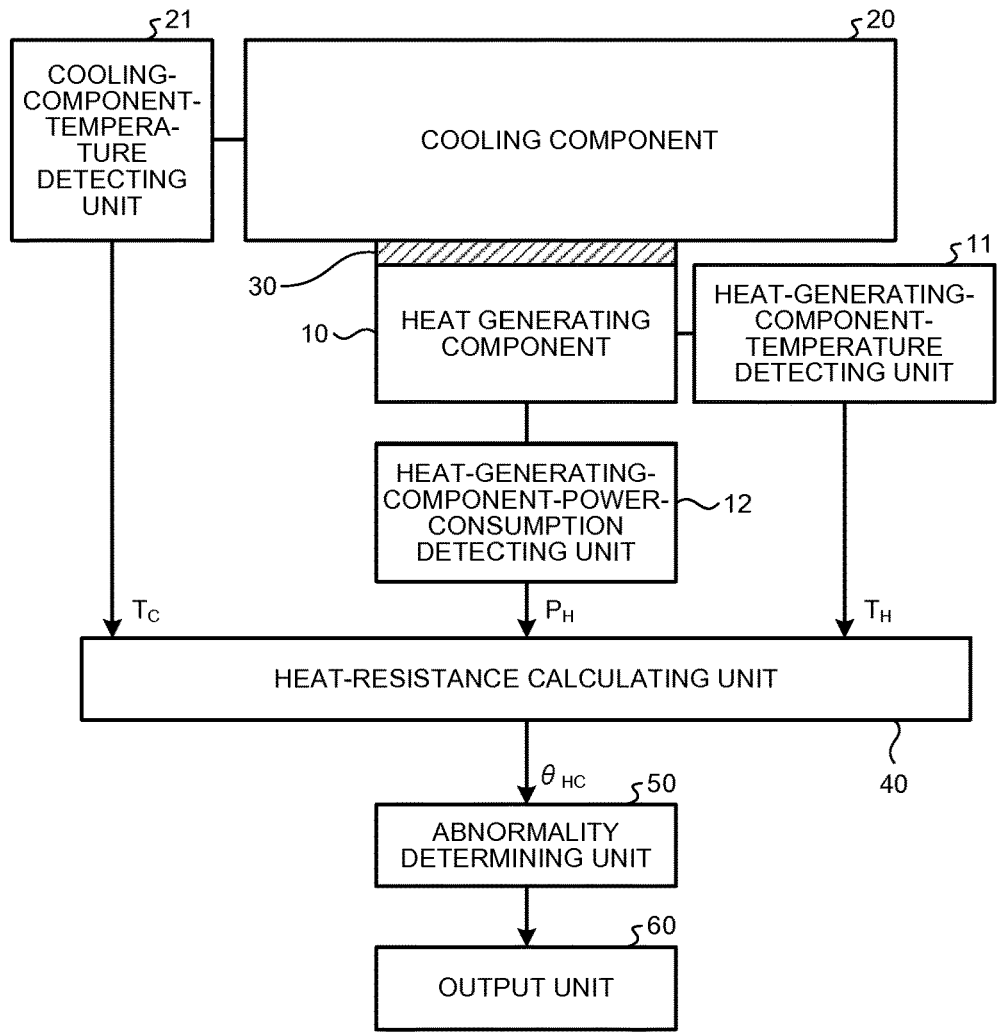
FIG. 1 is a diagram illustrating the configuration of a cooling-abnormality detecting system according to a first embodiment.

FIG. 1 is a diagram illustrating the configuration of a cooling-abnormality detecting system according to a first embodiment of the present invention. The cooling-abnormality detecting system illustrated in FIG. 1 includes: a heat generating component 10; a heat-generating-component-temperature detecting unit 11 that detects temperature $T_H$ of the heat generating component 10; a heat-generating-component-power-consumption detecting unit 12 that detects a power consumption value $P_H$ in the heat generating component 10; a cooling component 20 that performs heat radiation from the heat generating component 10 via a contact section 30; a cooling-component-temperature detecting unit 21 that detects temperature $T_C$ of the cooling component 20; and a heat-resistance calculating unit 40 that calculates a heat resistance value $\theta_{HC}$ between the heat generating component 10 and the cooling component 20 using the temperature $T_H$ of the heat generating component 10, the temperature $T_C$ of the cooling component 20, and a power consumption value $P_H$ and outputs the heat resistance value $\theta_{HC}$. The cooling-abnormality detecting system performs abnormality detection for the contact section 30 between the heat generating component 10 and the cooling component 20 according to the heat resistance value $\theta_{HC}$.

An example of the heat generating component 10 is a CPU (Central Processing Unit) of a computer or a power semiconductor including an IGBT or a diode. The heat generating component 10 may be a plurality of electronic circuit components including semiconductor elements configured from silicon or may be a plurality of electronic circuit components including wide band gap semiconductor elements configured from silicon carbide SiC, gallium nitride GaN, or diamond capable of operating at a higher temperature than the silicon semiconductor can. The heat generating component 10 may be an electronic circuit component obtained by combining a plurality of the semiconductor elements.

The heat-generating-component-temperature detecting unit 11 is heat-generating-component-temperature detecting apparatus that detects the temperature of the heat generating component 10 and outputs the temperature $T_H$ to the heat-resistance calculating unit 40. An example of the heat-generating-component-temperature detecting unit 11 is a heat sensitive element provided in contact with the inside or the outside of the heat generating component 10.

The heat-generating-component-power-consumption detecting unit 12 is heat-generating-component-power-consumption detecting apparatus that detects a power consumption value of the heat generating component 10 and outputs the power consumption value $P_H$ to the heat-resistance calculating unit 40. The heat-generating-component-power-consumption detecting unit 12 detects an electric current and a voltage of the heat generating component 10 and calculates the power consumption value $P_H$ as a product of the electric current and the voltage.

The cooling component 20 performs heat radiation from the heat generating component 10 via the contact section 30 to cool down the heat generating component 10. As a cooling system for the cooling component 20, a natural air cooling system, a forced air cooling system, a water cooling system, a coolant cooling system, a heat pipe system, and a Peltier system can be exemplified and enumerated.

The cooling-component-temperature detecting unit 21 is cooling-component-temperature detecting apparatus that detects the temperature of the cooling component 20 and outputs the temperature $T_C$ to the heat-resistance calculating unit 40. An example of the cooling-component-temperature detecting unit 21 is a temperature sensitive element provided on the inside of the cooling component 20 or provided in contact with the outer side of the cooling component 20.

The heat-resistance calculating unit 40 is heat-resistance calculating apparatus that calculates the heat resistance value $\theta_{HC}$ of the contact section 30 between the heat generating component 10 and the cooling component 20 using the temperature $T_H$ of the heat generating component 10, the temperature $T_C$ of the cooling component 20, and the power consumption value $P_H$ of the heat generating component 10 and outputs the heat resistance value $\theta_{HC}$. The heat-resistance calculating unit 40 can be realized by a CPU of a computer or a microcomputer. The heat-resistance calculating unit 40 may be realized by a CPU, which is the heat generating component 10. The heat resistance value $\theta_{HC}$ output from the heat-resistance calculating unit 40 is input to an abnormality determining unit 50.

The abnormality determining unit 50 determines presence or absence of abnormality detection in the contact section 30 between the heat generating component 10 and the cooling component 20 according to the heat resistance value $\theta_{HC}$. When the heat resistance value $\theta_{HC}$ is out of a preset range, the abnormality-determining unit 50 outputs an abnormality signal to an output unit 60. Alternatively, the abnormality-determining unit 50 may output the heat resistance value $\theta_{HC}$ to the output unit 60 together with the abnormality signal. Note that the abnormality determining unit 50 can be realized by a CPU of a computer. The abnormality determining unit 50 may be realized by a CPU which is the heat generating component 10.

The output unit 60 only has to be a notifying apparatus that notifies abnormality, and a display device can be exemplified. Alternatively, the output unit 60 may be configured to, when the abnormality signal is input, light or blink a lamp for an abnormality signal provided in the cooling system. Note that the notifying apparatus is not limited to visual notifying apparatus. The notifying apparatus may be configured to sound a buzzer when the abnormality signal is input. When the output unit 60 is such notifying apparatus, a user can recognize via the senses of the user that abnormality has occurred in the contact section 30 in the cooling system.

Alternatively, when the output unit 60 is the display device, the output unit 60 may be configured such that not only presence or absence of abnormality but also the heat resistance value $\theta_{HC}$ is displayed on the display device. Alternatively, the output unit 60 may be configured such that presence or absence of abnormality is not displayed but the heat resistance value $\theta_{HC}$ is simply displayed on the display device. When the output unit 60 is configured in this way, the user can recognize the heat resistance value $\theta_{HC}$.

Alternatively, a notification target of the output unit 60 may be the heat generating component 10 rather than the user. The output unit 60 may be configured such that the abnormality signal output by the output unit 60 is input to the heat generating component 10 and the heat generating component 10 is stopped. Alternatively, the output unit 60 may be configured such that the heat resistance value $\theta_{HC}$ output by the output unit 60 is input to the heat generating component 10 and a power consumption value of the heat generating component 10 is limited according to the heat resistance value $\theta_{HC}$. With such a configuration, it is possible to control and operate the heat generating component 10 not to exceed an allowable power consumption value. Therefore, it is possible to continuously operate the heat generating component 10 without stopping thereof.

Figure 2:
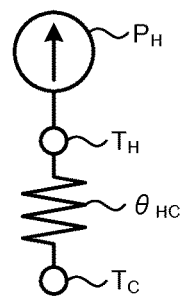
FIG. 2 is a diagram illustrating a concept of heat resistance calculation in the first embodiment.

FIG. 2 is a diagram illustrating a concept of heat resistance calculation. As illustrated in FIG. 2, the heat-resistance calculating unit 40 calculates the heat resistance value $\theta_{HC}$ of the contact section 30 by dividing a temperature difference between the temperature $T_H$ of the heat generating component 10 and the temperature $T_C$ of the cooling component 20 by the power consumption value $P_H$ of the heat generating component 10. That is, the heat resistance value $\theta_{HC}$ is represented by the following Formula (1):

$$\theta_{HC} = \frac{T_H - T_C}{P_H} \qquad (1)$$

The heat resistance value $\theta_{HC}$ calculated by the above Formula (1) is input to the abnormality determining unit 50. The abnormality determining unit 50 determines whether the heat resistance value $\theta_{HC}$ is within the preset range. When the heat resistance value $\theta_{HC}$ is out of the preset range, an abnormality signal is output from the abnormality determining unit 50 to the output unit 60. Alternatively, the heat resistance value $\theta_{HC}$ is output from the abnormality determining unit 50 to the output unit 60.

In the conventional technology, although it is possible to detect whether abnormality is present in the entire cooling system, it is difficult to specify a specific abnormal part, thus time and costs are required to specify the abnormal part. As an example, when abnormality is detected in the forced air cooling system, it is difficult in the conventional technology to distinguish whether a cause of the abnormality is lack of an inflow air volume to a heat sink, which is the cooling unit, or a contact failure between the heat sink, which is the cooling unit, and the heat generating component, thus time and costs are required to specify the cause of the abnormality. In a complicated cooling system employing the water cooling system or a coolant cooling system by a coolant other than the air and the water, it is particularly difficult to specify the abnormal part, thus a lot of time and costs are required to specify the abnormal part. Therefore, not only during shipment inspection of the cooling system but also during a maintenance service or during repairing, time and costs are required to specify and restore the abnormal part. This is inconvenient for both of a manufacturer side and a consumer side.

With the configuration explained in this embodiment, it is possible to detect presence or absence of abnormality in the contact section between the heat generating component and the cooling component. Therefore, even when abnormality is detected during shipment inspection of the cooling system, during a maintenance service, or during repairing, it is possible to quickly specify and repair an abnormal part without requiring time and costs to specify the abnormal part.

Further, with the configuration explained in this embodiment, it is possible to accurately and continuously calculate heat resistance. Therefore, when a power consumption value allowable by the heat generating component is fed back according to a degree of deterioration of the contact section due to an environment of use, it is possible to continuously operate the cooling system without stopping thereof. Note that, as the deterioration of the contact section, degradation or an outflow of silicon grease disposed in the contact section or deterioration of a fixing member that fixes the heat generating component and the cooling component can be exemplified. Note that an example of the deterioration of the fixing member is loosening of a screw, which is the fixing member.

Second Embodiment

Figure 3:
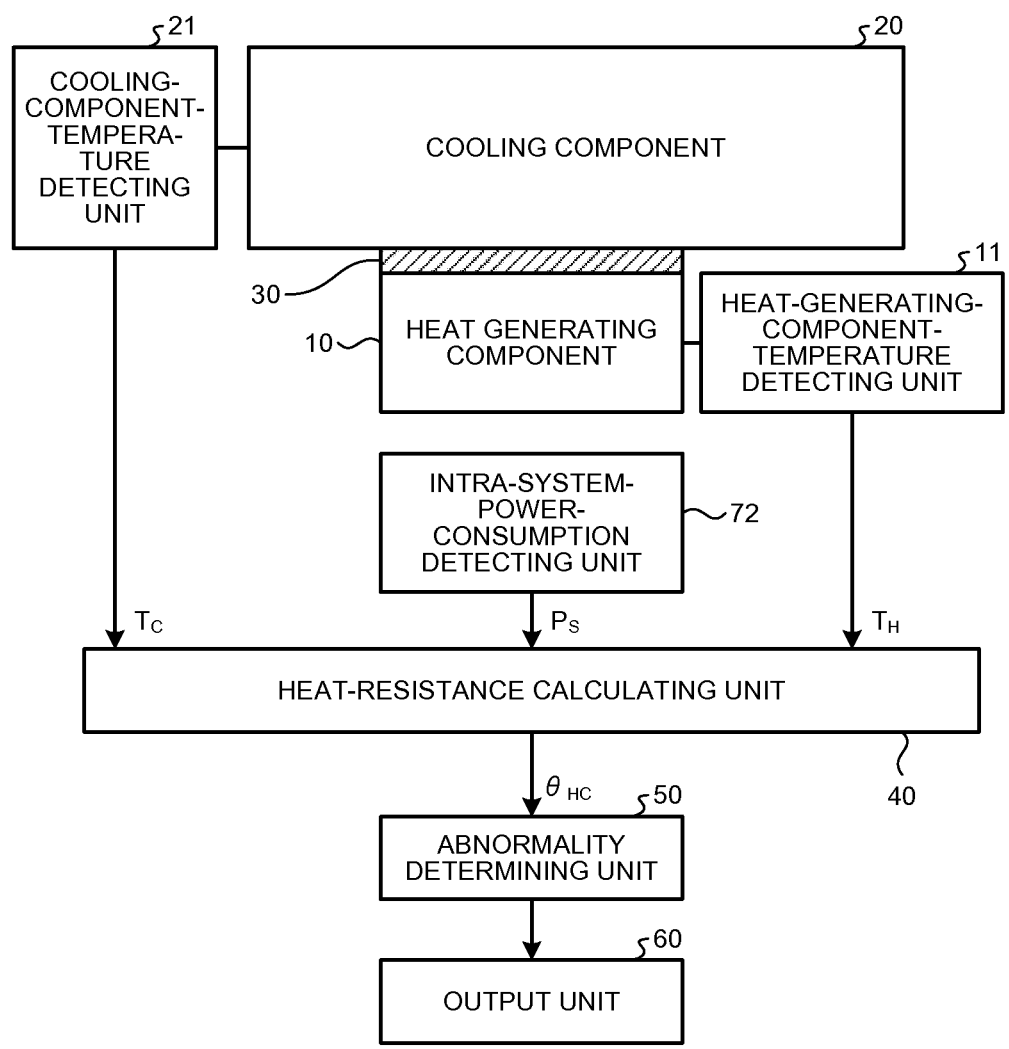
FIG. 3 is a diagram illustrating the configuration of a cooling-abnormality detecting system in a second embodiment.

FIG. 3 is a diagram illustrating the configuration of a cooling-abnormality detecting system according to a second embodiment of the present invention. The cooling-abnormality detecting system illustrated in FIG. 3 includes an intra-system-power-consumption detecting unit 72 instead of the heat-generating-component-power-consumption detecting unit 12 in the cooling-abnormality detecting system illustrated in FIG. 1.

The intra-system-power-consumption detecting unit 72 is intra-system-power-consumption detecting apparatus that detects a power consumption value of the entire system including: the heat generating component 10; the cooling component 20; the heat-generating-component-temperature detecting unit 11; and the cooling-component-temperature detecting unit 21, and that outputs a power consumption value $P_S$ to the heat-resistance calculating unit 40. The intra-system-power-consumption detecting unit 72 detects the electric current and the voltage of the entire system and calculates the power consumption value $P_S$ as a product of the electric current and the voltage.

In the cooling-abnormality detecting system illustrated in FIG. 3, a power consumption value of the heat generating component 10 and the power consumption value of the entire system including: the heat generating component 10; the cooling component 20; the heat-generating-component-temperature detecting unit 11, and the cooling-component-temperature detecting unit 21 are substantially equal values. That is, a component that consumes electric power in the system is only the heat generating component 10. Alternatively, in calculation of heat resistance, a power consumption value of the cooling component 20, the heat-generating-component-temperature detecting unit 11, and the cooling-component-temperature detecting unit 21 is a negligible value compared to the power consumption value of the heat generating component 10. Specifically, when the power consumption value of the heat generating component 10 is a value exceeding ten times of the power consumption value of the cooling component 20, the heat-generating-component-temperature detecting unit 11, and the cooling-component-temperature detecting unit 21; the power consumption value of the cooling component 20, the heat-generating-component-temperature detecting unit 11, and the cooling-component-temperature detecting unit 21 can be considered a negligible value. With such a configuration, it is possible to realize the present invention without providing the heat-generating-component-power-consumption detecting unit 12.

Third Embodiment

Figure 4:
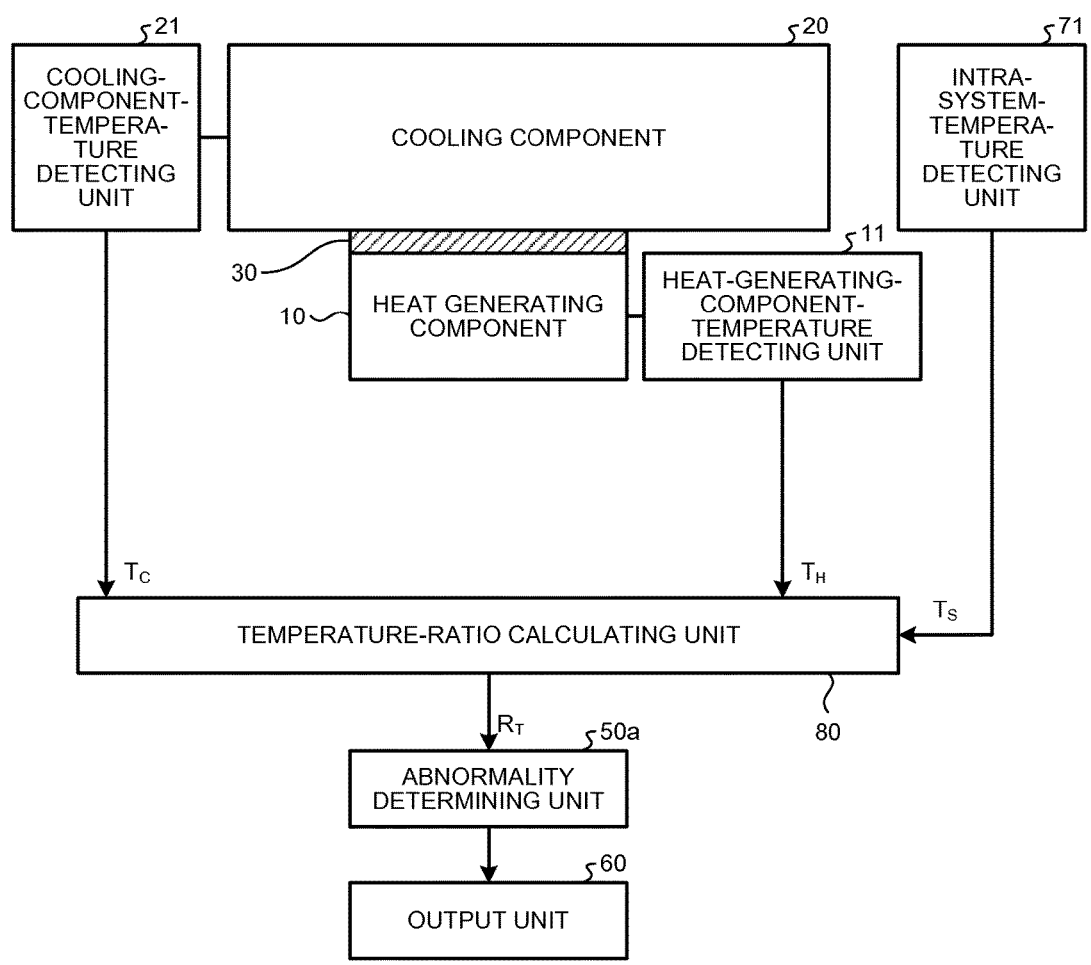
FIG. 4 is a diagram illustrating the configuration of a cooling-abnormality detecting system according to a third embodiment.

FIG. 4 is a diagram illustrating the configuration of a cooling-abnormality detecting system according to a third embodiment of the present invention. In the cooling-abnormality detecting system illustrated in FIG. 4, the heating-generating-component-power-consumption detecting unit 12 in the cooling-abnormality detecting system illustrated in FIG. 1 is not provided, an intra-system-temperature detecting unit 71 is provided, and a temperature-ratio calculating unit 80 is provided instead of the heat-resistance calculating unit 40. Further, an abnormality determining unit 50a is provided instead of the abnormality determining unit 50.

The intra-system-temperature detecting unit 71 is provided in a housing in which the heat generating component 10 and the cooling component 20 are provided. The intra-system-temperature detecting unit 71 is intra-system-temperature detecting apparatus that detects the temperature in the housing and outputs temperature $T_S$ to the temperature-ratio calculating unit 80. In other words, the intra-system-temperature detecting unit 71 is ambient-temperature detecting apparatus that detects an ambient temperature in the system and outputs the ambient temperature. However, the intra-system-temperature detecting unit 71 is not limitedly provided in the housing in which the heat generating component 10 and the cooling component 20 are provided. As an example, in the forced air cooling system, the intra-system-temperature detecting unit 71 may be provided on the outer side of the housing in which the heat generating component 10 and the cooling component 20 are provided and may be configured to detect the temperature of the air blown on the cooling component 20.

The temperature-ratio calculating unit 80 is temperature-ratio calculating apparatus that calculates a ratio $R_T$ of a temperature difference according to the following Formula (2) using the temperature $T_H$ of the heat generating component 10, the temperature $T_C$ of the cooling component 20, and the temperature $T_S$ in the system, and that outputs the ratio $R_T$.

$$R_T = \frac{T_S - T_C}{T_H - T_C} \quad (2)$$

The temperature-ratio calculating unit 80 outputs the ratio $R_T$ of the temperature difference calculated by the above Formula (2) to the abnormality determining unit 50a. When the ratio RT of the temperature difference is out of a preset range, the abnormality determining unit 50a determines that abnormality is present in the contact section 30 between the heat generating component 10 and the cooling component 20. Note that the temperature-ratio calculating unit 80 can be realized by a CPU of a computer. The temperature-ratio calculating unit 80 may be realized by a CPU which is the heat generating component 10.

With the configuration explained in this embodiment, it is possible to determine abnormality of the contact section without calculating heat resistance.

Fourth Embodiment

Figure 5:
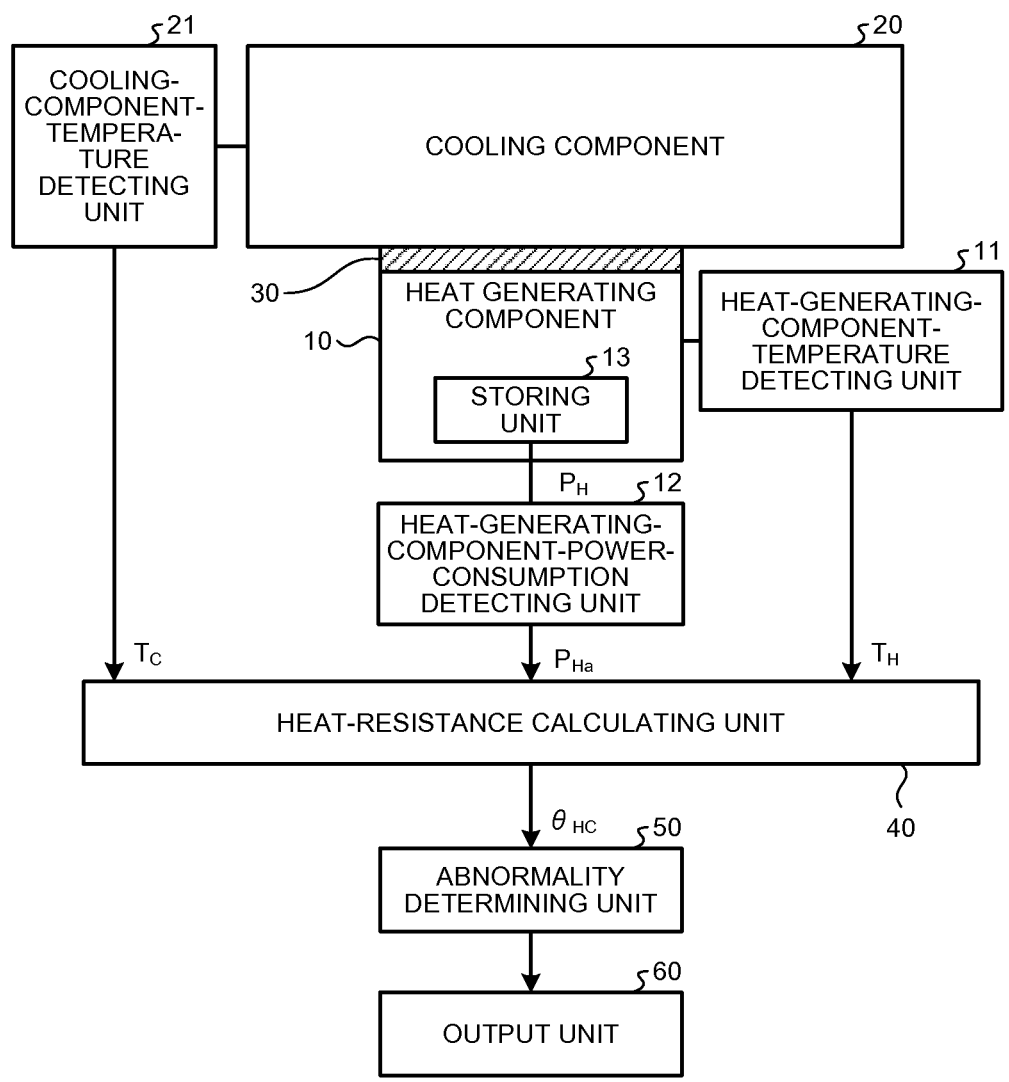
FIG. 5 is a diagram illustrating the configuration of a cooling-abnormality detecting system according to a fourth embodiment.

FIG. 5 is a diagram illustrating the configuration of a cooling-abnormality detecting system according to a fourth embodiment of the present invention. The cooling-abnormality detecting system illustrated in FIG. 5 is different from the cooling-abnormality detecting system illustrated in FIG. 1 in that the cooling-abnormality detecting system includes a storing unit 13 in the heat generating component 10.

In the storing unit 13, characteristics of the heat generating component 10 measured in advance are stored. The heat-generating-component-power-consumption detecting unit 12 corrects the acquired power consumption value $P_H$ with the characteristics of the heat generating component 10 and outputs a power-consumption correction value $P_{Ha}$ to the heat-resistance calculating unit 40. With such a configuration, it is possible to acquire a highly accurate power consumption value corresponding to the characteristics of the heat generating component 10 and improve the accuracy of the calculated heat resistance value $\theta_{HC}$.

Alternatively, the power consumption value $P_H$ of the heat generating component 10 corresponding to an operation mode or a test mode may be stored in the storing unit 13. The heat-generating-component-power-consumption detecting unit 12 may be configured to read out the power consumption value $P_H$ according to the operation mode or the test mode of the heat generating component 10 and to output the power consumption value $P_H$ to the heat-resistance calculating unit 40.

Alternatively, the configuration illustrated in FIG. 3 and the configuration illustrated in FIG. 5 may be combined. The power consumption value $P_S$ of the entire system corresponding to the operation mode or the test mode may be stored in the storing unit 13. The intra-system-power-consumption detecting unit 72 may read out the power consumption value $P_S$ according to the operation mode or the test mode of the heat generating component 10 and output the power consumption value $P_S$ to the heat-resistance calculating unit 40.

As explained above in the embodiments, it is possible to detect abnormality in the contact section between the heat generating component and the cooling component. Because presence or absence of abnormality in the contact section can be detected in this way, when there is a problem in heat radiation of the heat generating component, it is possible to clarify whether abnormality is present in the cooling component or present in the contact section between the heat generating component and the cooling component. It is possible to distinguish an abnormal part. Therefore, when abnormality occurs in the cooling system, it is possible to specify an abnormal part. By specifying the abnormal part, it is possible to repair or replace the abnormal part and quickly take measures against the abnormality.

According to the present invention, there is an effect that it is possible to obtain the cooling-abnormality detecting system capable of detecting abnormality in the contact section between the heat generating component and the cooling component.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A cooling-abnormality detecting system configured to perform abnormality detection for a cooling system, comprising:
    a heat generating component;
    a cooling component;
    a contact section, wherein the heat generating component and the cooling component come into contact with each other via the contact section which is sandwiched between and in direct contact with the cooling component and the heat generating component, and the cooling component is configured to perform heat radiation from the heat generating component;
    a heat-generating-component-temperature detecting sensor configured to detect a temperature of the heat generating component;
    a heat-generating-component-power-consumption detecting sensor configured to detect a power consumption value in the heat generating component;
    a cooling-component-temperature detecting sensor configured to detect a temperature of the cooling component, wherein the cooling-component-temperature detecting sensor is in direct contact with the cooling component; and
    a processor configured to, during standard operation mode of the heat generating component:
    calculate a heat resistance value of the contact section between the heat generating component and the cooling component using the temperature of the heat generating component, the temperature of the cooling component, and the power consumption value and output the heat resistance value, and
    determine presence or absence of an abnormality of the contact section between the heat generating component and the cooling component based on the heat resistance value.

2. The cooling-abnormality detecting system according to claim 1, further comprising an intra-system-temperature detecting sensor that detects an intra-system temperature, which is temperature in a housing in which the heat generating component and the cooling component are provided.

3. The cooling-abnormality detecting system according to claim 2, wherein the processor is further configured to
    calculate a ratio of a temperature difference between the intra-system temperature and the temperature of the cooling component and a temperature difference between the temperature of the cooling component and the temperature of the heat generating component, and when the calculated ratio is out of a preset range, the processor determines that abnormality is present between the heat generating component and the cooling component.

4. The cooling-abnormality detecting system according to claim 1, further comprising a storage unit configured to store characteristics of the heat generating component measured in advance, wherein the heat-generating-component-power-consumption detecting sensor corrects the power consumption value according to the characteristics of the heat generating component, and the power consumption input to the processor is a corrected value.

5. The cooling-abnormality detecting system according to claim 1, further comprising a storage unit, wherein the processor is further configured to store, in the storage unit, the power consumption value corresponding to an operation mode or a test mode, and read the power consumption value, which is used to calculate the heat resistance value, from the storage unit.

6. The cooling-abnormality detecting system according to claim 1, wherein the cooling component is configured to perform the heat radiation from the heat generating component using any one of a natural air cooling system, a force air cooling system, a water cooling system, a coolant cooling system, a heat pipe system, and a Peltier system.

7. The cooling-abnormality detecting system according to claim 1, wherein the heat-generating-component-temperature detecting sensor is a temperature sensitive element provided on an inside of the heat generating component or provided in contact with an outer side of the heat generating component.

8. The cooling-abnormality detecting system according to claim 1, wherein the heat generating component includes a plurality of electronic circuit components, the plurality of electric circuit components include a wide band gap semiconductor or a silicon semiconductor, the wide band gap semiconductor or the silicon semiconductor includes silicon carbide, gallium nitride, or diamond.

9. The cooling-abnormality detecting system according to claim 1, wherein the cooling-component-temperature detecting sensor is a temperature sensitive element disposed on an inside of the cooling component.

10. The cooling-abnormality detecting system according to claim 1, wherein the cooling-component-temperature detecting sensor is a temperature sensitive element provided in contact with an outer side of the cooling component.

11. The cooling-abnormality detecting system according to claim 1, wherein the processor is further configured to output an abnormality signal indicating the presence in the contact section of the abnormality which is determined to an output display, lamp, light or buzzer.

12. The cooling-abnormality detecting system according to claim 1, wherein the processor is further configured to output an abnormality signal indicating the presence in the contact section of the abnormality which is determined to the heat generating component.

13. The cooling-abnormality detecting system according to claim 1, wherein the processor is further configured to continuously calculate the heat resistance value using the detected temperature of the heat generating component and the temperature of the cooling component, while the cooling system continuous to operate without being stopped.

* * * * *